(12) United States Patent
Bao et al.

(10) Patent No.: US 9,997,519 B1
(45) Date of Patent: Jun. 12, 2018

(54) DUAL CHANNEL STRUCTURES WITH MULTIPLE THRESHOLD VOLTAGES

(71) Applicant: International Business Machines Corporation, Armonk, NY (US)

(72) Inventors: Ruqiang Bao, Wappingers Falls, NY (US); Michael A. Guillorn, Cold Springs, NY (US); Vijay Narayanan, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days. days.

(21) Appl. No.: 15/585,608

(22) Filed: May 3, 2017

(51) Int. Cl.
*H01L 27/092* (2006.01)
*H01L 29/49* (2006.01)
*H01L 29/06* (2006.01)
*H01L 21/8238* (2006.01)

(52) U.S. Cl.
CPC .... *H01L 27/092* (2013.01); *H01L 21/823807* (2013.01); *H01L 21/823828* (2013.01); *H01L 29/0665* (2013.01); *H01L 29/495* (2013.01); *H01L 29/4966* (2013.01)

(58) Field of Classification Search
CPC ..... H01L 21/823807; H01L 21/823828; H01L 29/495; H01L 29/4966; H01L 27/0922; H01L 29/0665–29/068; H01L 21/8238–21/823892; H01L 27/092–27/0928; H01L 27/1807; H01L 2027/11809–2027/11894; H01L 29/04–29/045; H01L 29/16–29/1608; H01L 29/18–29/185; H01L 29/22–29/2206; H01L 29/36–29/365; B81C 2203/0728; B81C 2203/0735; B81C 2203/0742
See application file for complete search history.

(56) References Cited

U.S. PATENT DOCUMENTS

| | | |
|---|---|---|
| 6,291,282 B1 | 9/2001 | Wilk et al. |
| 6,653,698 B2 | 11/2003 | Lee et al. |
| 6,873,020 B2 | 3/2005 | Misra et al. |
| 7,018,883 B2 | 3/2006 | Wang et al. |
| 7,439,113 B2 | 10/2008 | Doczy et al. |
| 7,504,696 B2 | 3/2009 | Zhu et al. |
| 7,781,290 B2 | 8/2010 | Lee et al. |

(Continued)

*Primary Examiner* — Scott B Geyer
(74) *Attorney, Agent, or Firm* — Vazken Alexanian; Ryan, Mason & Lewis, LLP

(57) ABSTRACT

A method of forming a semiconductor structure includes depositing a first work function metal layer in nanosheet channel stacks for first and second CMOS structure each including a first nanosheet channel stack for an nFET and a second nanosheet channel stack for a pFET. The method also includes patterning to remove the first work function metal layer surrounding nanosheet channels in the first nanosheet channel stack of the first CMOS structure and nanosheet channels in the second nanosheet channel stack of the second CMOS structure. The method further includes depositing a second work function metal layer to surround the nanosheet channels in the first nanosheet channel stack of the first CMOS structure and the nanosheet channels in the second nanosheet channel stack of the second CMOS structure. The first CMOS structure has a first threshold voltage and the second CMOS structure has a second threshold voltage.

20 Claims, 13 Drawing Sheets

(56) References Cited

U.S. PATENT DOCUMENTS

| | | |
|---|---|---|
| 7,824,986 B2 | 11/2010 | Gurtej et al. |
| 8,008,144 B2 | 8/2011 | Ananthan et al. |
| 8,034,687 B2 | 10/2011 | Gurtej et al. |
| 8,237,233 B2 | 8/2012 | Anderson et al. |
| 8,883,578 B2 | 11/2014 | Basker et al. |
| 9,129,863 B2 | 9/2015 | Caimi et al. |
| 9,356,046 B2 | 5/2016 | Cheng et al. |
| 9,362,355 B1 | 6/2016 | Cheng et al. |
| 9,425,291 B1 | 8/2016 | Balakrishnan et al. |
| 9,881,998 B1 * | 1/2018 | Cheng ................ H01L 29/0649 |
| 2016/0071729 A1 * | 3/2016 | Hatcher .............. H01L 29/1033 257/347 |
| 2016/0211328 A1 | 7/2016 | Lauer et al. |
| 2016/0225789 A1 | 8/2016 | Doris et al. |
| 2017/0213911 A1 * | 7/2017 | Balakrishnan ...... H01L 29/7848 |
| 2017/0256611 A1 * | 9/2017 | Kim ................... H01L 29/0673 |

\* cited by examiner

100

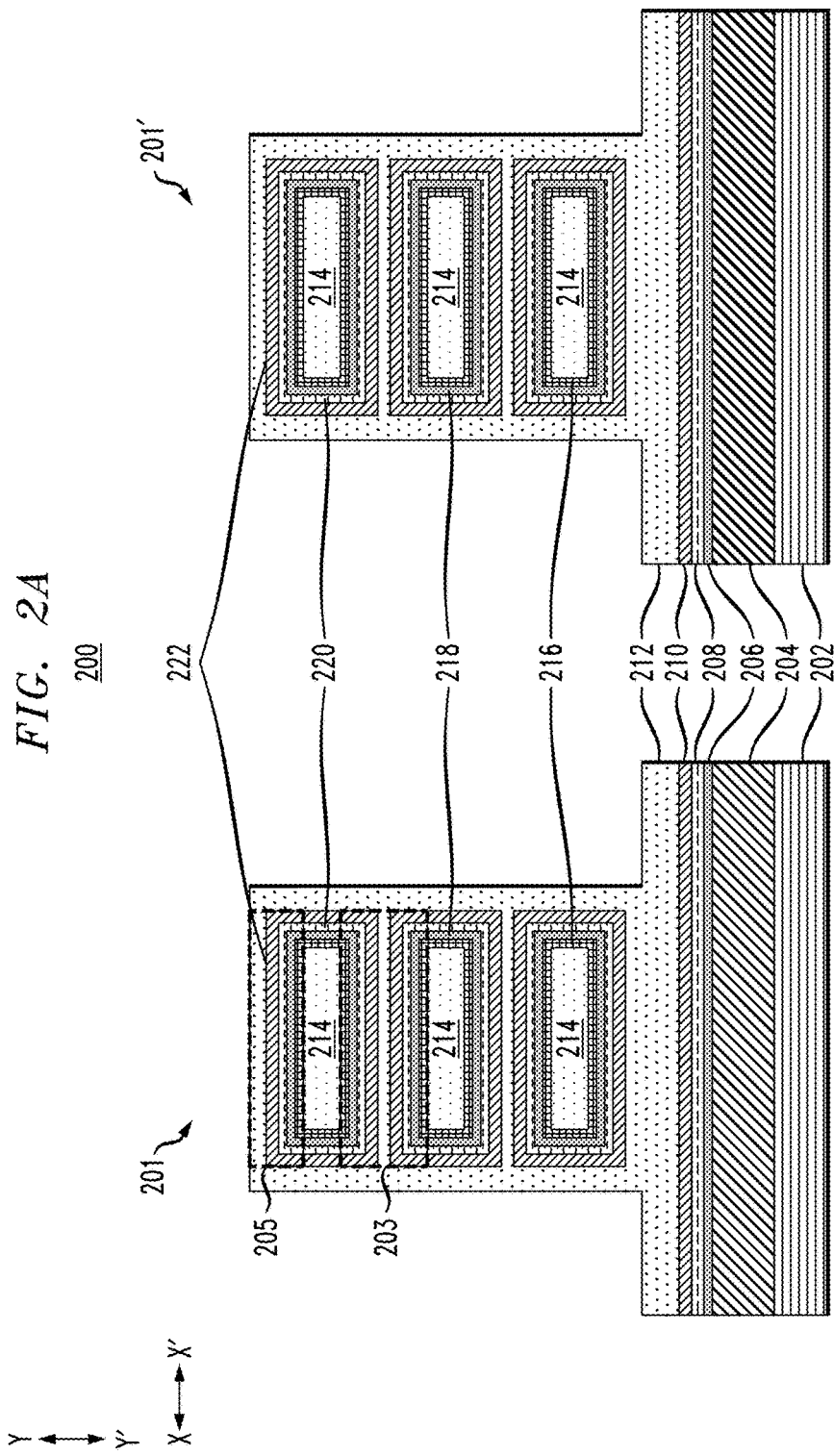

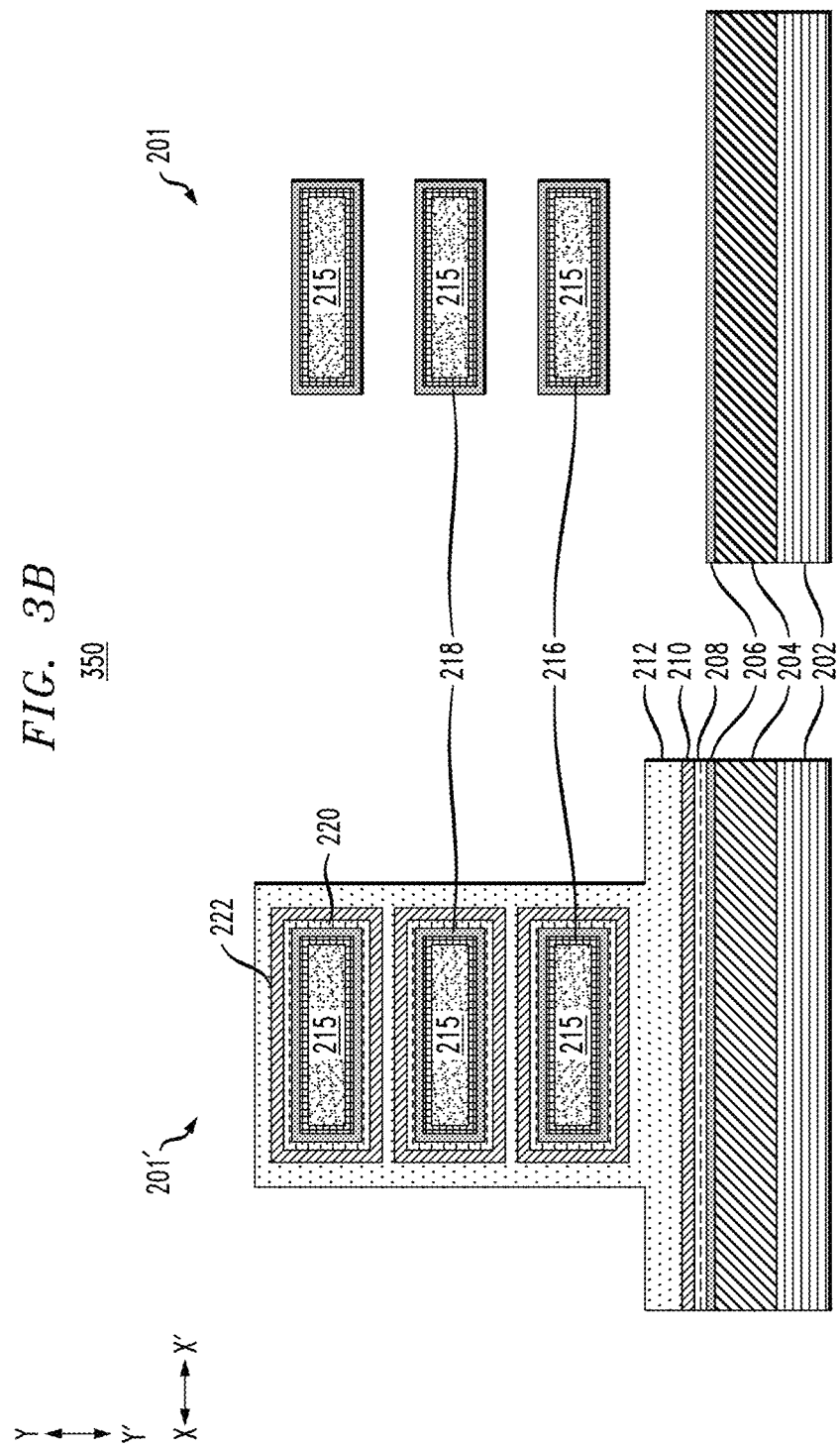

400

450

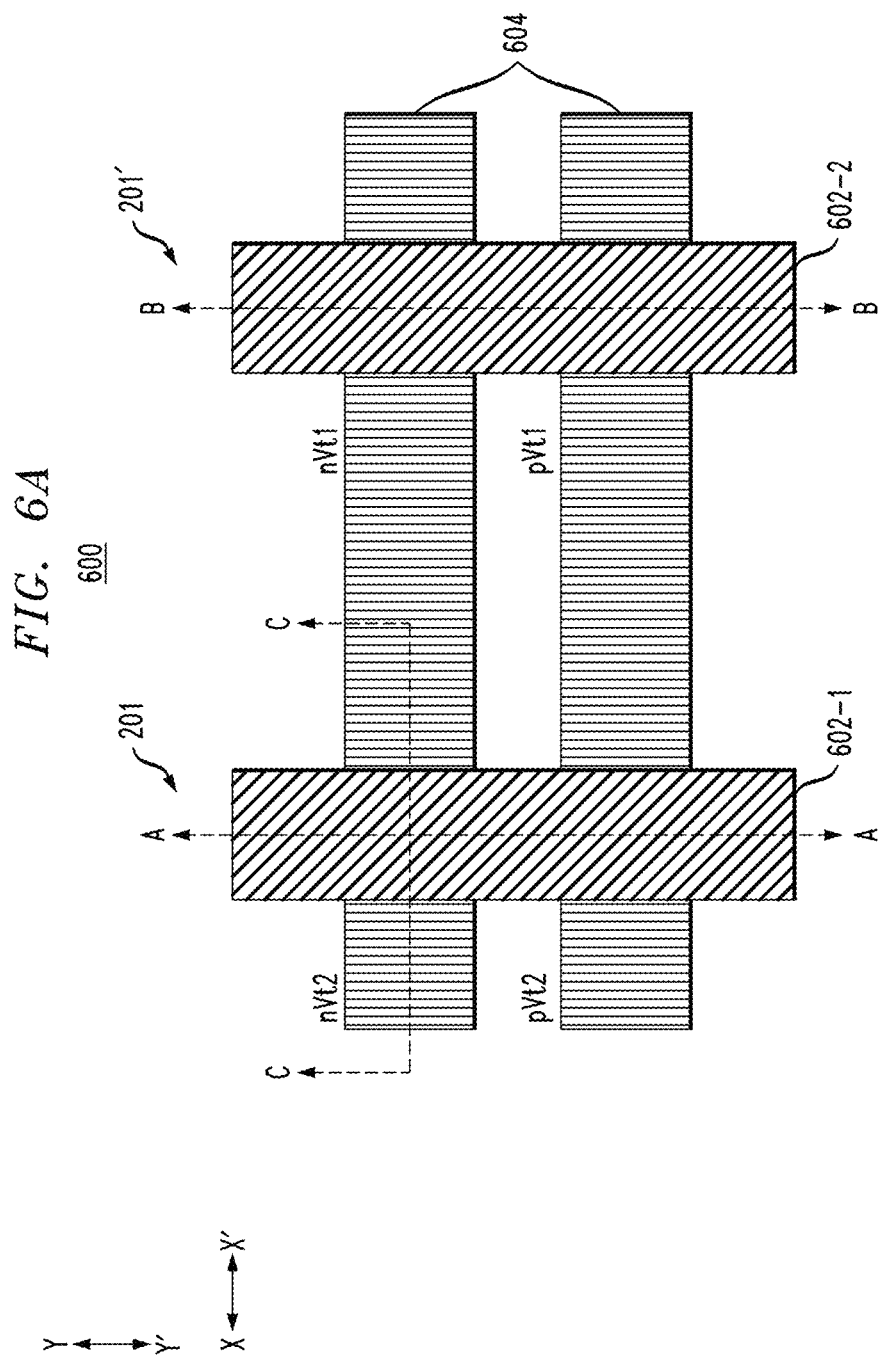

625

650

675

DUAL CHANNEL STRUCTURES WITH MULTIPLE THRESHOLD VOLTAGES

BACKGROUND

The present application relates to semiconductors, and more specifically, to techniques for forming semiconductor structures. Semiconductor devices, such as those utilizing semiconductor fin field-effect transistors (FinFETs), are an evolution of complementary metal-oxide-semiconductor (CMOS) devices. In some semiconductor devices utilizing FinFETs, gate around device nanosheet or nanowire technology is used to form a device channel comprising one or more layers of nanosheets. In nanosheet technology, each nanosheet has a vertical thickness substantially less than the width of that nanosheet. Gate structures may be formed above and below each nanosheet.

SUMMARY

Embodiments of the invention provide techniques for forming dual channel structures with multiple threshold voltages.

For example, in one embodiment a method of forming a semiconductor structure comprises depositing a first work function metal layer surrounding nanosheet channels in nanosheet channel stacks for a first complementary metal-oxide-semiconductor (CMOS) structure and at least a second CMOS structure, each of the first CMOS structure and the second CMOS structure comprising a first nanosheet channel stack for a negative-channel field-effect transistor (nFET) comprising two or more nanosheet channels of a first channel material and a second nanosheet channel stack for a positive-channel field-effect transistor (pFET) comprising two or more nanosheet channels of a second channel material different than the first channel material. The method also comprises patterning to remove the first work function metal layer surrounding the two or more nanosheet channels in the first nanosheet channel stack of the first CMOS structure and to remove the first work function metal layer surrounding the two or more nanosheet channels in the second nanosheet channel stack of the second CMOS structure. The method further comprises depositing a second work function metal layer to surround the two or more nanosheet channels in the first nanosheet channel stack of the first CMOS structure and to surround the two or more nanosheet channels in the second nanosheet channel stack of the second CMOS structure.

In another embodiment, a semiconductor structure comprises a first complementary metal-oxide-semiconductor (CMOS) structure and at least a second CMOS structure, each of the first CMOS structure and the second CMOS structure comprising a first nanosheet channel stack for a negative-channel field-effect transistor (nFET) comprising two or more nanosheet channels of a first channel material and a second nanosheet channel stack for a positive-channel field-effect transistor (pFET) comprising two or more nanosheet channels of a second channel material different than the first channel material. A first work function metal layer surrounds the two or more nanosheet channels of the second nanosheet channel stack in the first CMOS structure and the two or more nanosheet channels of the first nanosheet channel stack in the second CMOS structure. A second work function metal layer surrounds the two or more nanosheet channels of the first nanosheet channel stack in first CMOS structure and the two or more nanosheet channels of the second nanosheet channel stack in the second CMOS structure.

In another embodiment, an integrated circuit comprises a semiconductor structure comprising a first complementary metal-oxide-semiconductor (CMOS) structure and at least a second CMOS structure. Each of the first CMOS structure and the second CMOS structure comprises a first nanosheet channel stack for a negative-channel field-effect transistor (nFET) comprising two or more nanosheet channels of a first channel material and a second nanosheet channel stack for a positive-channel field-effect transistor (pFET) comprising two or more nanosheet channels of a second channel material different than the first channel material. A first work function metal layer surrounds the two or more nanosheet channels of the second nanosheet channel stack in the first CMOS structure and the two or more nanosheet channels of the first nanosheet channel stack in the second CMOS structure. A second work function metal layer surrounds the two or more nanosheet channels of the first nanosheet channel stack in first CMOS structure and the two or more nanosheet channels of the second nanosheet channel stack in the second CMOS structure.

BRIEF DESCRIPTION OF THE DRAWINGS

FIG. 2A illustrates a cross-sectional view of a negative channel portion of CMOS structures resulting from deposition of a first work function material, according to an embodiment of the present invention.

FIG. 3B illustrates a cross-sectional view of the FIG. 2B structure following removal of the first work function material from a portion of the structure, according to an embodiment of the present invention.

FIG. 6A illustrates a top-down view of first and second CMOS structures, according to an embodiment of the invention.

DETAILED DESCRIPTION

Illustrative embodiments of the invention may be described herein in the context of illustrative methods for forming dual channel structures with multiple threshold voltages, along with illustrative apparatus, systems and devices having dual channel structures formed using such methods. However, it is to be understood that embodiments of the invention are not limited to the illustrative methods, apparatus, systems and devices but instead are more broadly applicable to other suitable methods, apparatus, systems and devices.

CMOS devices include negative channel field-effect transistors (nFETs) and positive channel field-effect transistors (pFETs). Dual channel CMOS devices utilize different channel materials in the nFETs and pFETs, such as using silicon (Si) for nFET channels and silicon germanium (SiGE) for pFET channels. Multiple threshold voltage (Vt) CMOS devices are desired in structures such as nanosheet CMOS devices. Described herein are techniques for ensuring Vt uniformity in both nFETs and pFETs of a nanosheet CMOS device for dual work function (WF) metal gates and multi-Vt with the same patterning to provide more Vts. In some embodiments, it is desired to provide a multi-Vt scheme with dual channel nanosheet CMOS devices without dipole like lanthanum oxide to define multi-Vt due to two reasons. First, additional patterning required in dipole is challenging and reliable packaging is not available. Second, the dipole method reduces the mobility thus impacting the final performance.

Figure 1:
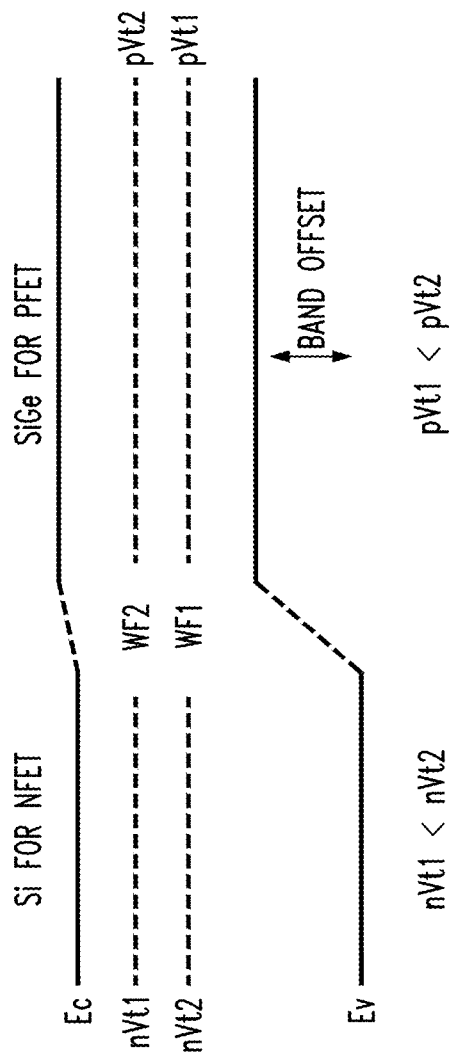
FIG. 1 depicts a band diagram for a multiple threshold voltage dual channel device, according to an embodiment of the present invention.

FIG. 1 illustrates a band diagram 100 for a multi-Vt CMOS device utilizing a first work function (WF1) and second work function (WF2) material for the gate. The band diagram 100 illustrates the conduction band edge (Ec), the valence band edge (Ev), and the band offset between Si and SiGe, where Si is used as the channel material for nFET and SiGe is used as the channel material for pFET. The nFET has two threshold voltages—a first threshold voltage nVt1 associated with WF2 and a second threshold voltage nVt2 associated with WF1. The pFET similarly has two threshold voltages—a first threshold voltage pVt1 associated with WF1 and a second threshold voltage pVt2 associated with WF2. The n-channel threshold voltages, nVt1 and nVt2, are related such that nVt1<nVt2. The p-channel threshold voltages, pVt1 and pVt2, are related such that pVt1<pVt2.

Embodiments provide a number of advantages for utilizing multiple WFs. For example, multi-Vt nanosheet CMOS devices formed using the techniques described herein can provide increased performance by reducing doping in the channels. In addition, fabrication is simplified by reducing the masks and patterning steps required to define multiple Vts. In addition, drawbacks caused by multi-Vt via lanthanum oxide ($La_2O_3$), such as reduced mobility, may be avoided.

In a general process flow for forming a nanosheet CMOS device, nanosheet release is followed by formation of an interfacial layer (IL) and a high-k dielectric layer. WF deposition is then performed, followed by an optional metal electrode deposition step and gate chemical mechanical planarization (CMP). Methods are described below for facilitating deposition of first and second WFs, WF1 and WF2, between formation of IL and high-k dielectric layers and the optional step of metal electrode deposition.

More particularly, WF1 metal deposition to be used for nVt2 (e.g., the higher Vt for nFET) and pVt1 (e.g., the lower Vt for pFET) is performed first, followed by patterning to remove WF1 material from one or more regions or areas of the device where WF2 material is to be formed. WF2 metal deposition is then performed in such regions for nVt1 (e.g., the lower Vt for nFET) and pVt1 (e.g., the higher Vt for pFET).

Figure 2B:
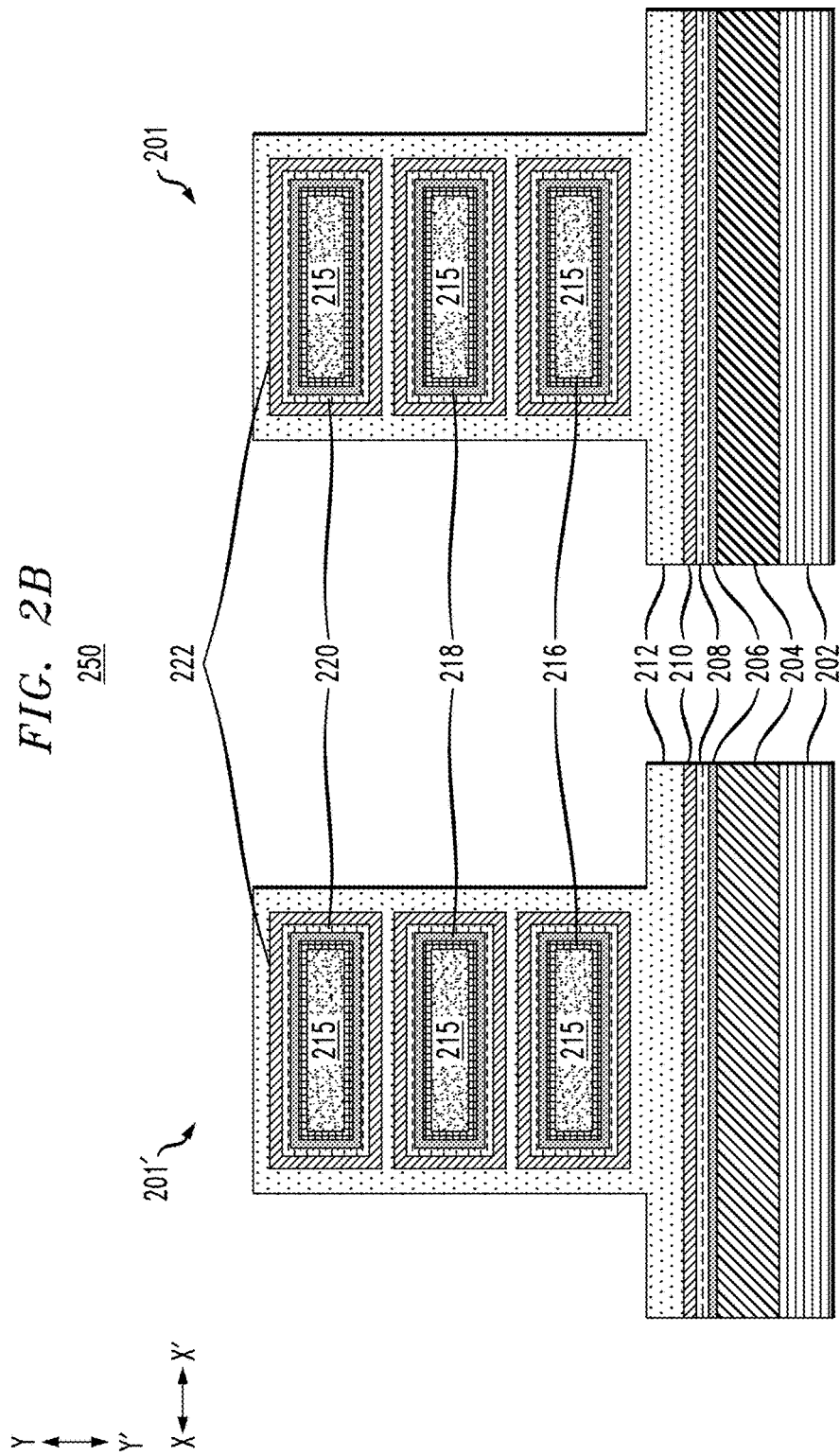
FIG. 2B illustrates a cross-sectional view of a positive channel portions of CMOS structures resulting from deposition of a first work function material, according to an embodiment of the present invention.

FIGS. 2A and 2B illustrate cross-sectional views 200 and 250, respectively, of the nFET and pFET portions of a CMOS structures resulting from deposition of the first work function, or WF1, material.

As shown in FIGS. 2A and 2B, the structure includes portions of two regions 201 and 201' for both nFET and pFET. The first region 201 represents an area where WF1 will be used for a first CMOS structure, while the second region 201' represents an area where WF2 will be used for a second CMOS structure. For clarity of illustration, the regions for only two CMOS structures are shown. It is to be appreciated, however, that a plurality of CMOS structures may be formed, including two or more CMOS structures using WF1 and/or WF2. In addition, in some embodiments more than two WFs may be used to form more than two CMOS structures. In some embodiments, the channel doping may be used to fine tune the Vts for two or more CMOSs.

The FIG. 2A structure includes a substrate 202, an isolator layer 204 formed over the substrate 202, a high-k dielectric layer 206 formed over the isolator layer 204, a barrier layer 208 formed over the high-k dielectric layer 206, and a scavenging metal layer 210 formed over the barrier layer 208.

The substrate 202 may be formed of Si. The substrate 202 may have a vertical thickness (in direction Y-Y') which ranges as desired. The horizontal width of the substrate 202 (in direction X-X') may vary as desired, such as based on the number of CMOS structures.

Isolator layer 204 may be formed of silicon dioxide ($SiO_2$). The isolator layer 204 may have a vertical thickness (in direction Y-Y') ranging from 5 nanometers (nm) to 20 nm. The horizontal width of the isolator layer 204 (in direction X-X') may match that of the underlying substrate 202.

High-k dielectric layer 206 may be formed of hafnium dioxide (HfO2). The high-k dielectric layer 206 may have a vertical thickness (in direction Y-Y') ranging from 1 nm to 3 nm. The horizontal width (in direction X-X') of the high-k dielectric layer 206 may match that of the underlying isolator layer 204.

Barrier layer 208 may be formed of titanium nitride (TiN), although other suitable materials such as titanium silicon nitride (TiSiN) and titanium carbide (TiC) may be used. The barrier layer 208 may have a vertical thickness (in direction Y-Y') ranging from 2 angstrom (A) to 20A. The horizontal width of the barrier layer 208 (in direction X-X') may match that of the underlying high-k dielectric layer 206.

Scavenging metal layer 210 may be formed of titanium (Ti), aluminum (Al), titanium aluminum (TiAl), tantalum aluminum carbon (TaAlC), titanium aluminum carbon (TiAlC), or any combination of Ti and Al alloys aforementioned. The scavenging metal layer 210 may have a vertical thickness (in direction Y-Y') ranging from 1 nm to 10 nm. The horizontal width (in direction X-X') of the scavenging metal layer 210 may match that of the underlying barrier layer 208. In some embodiment, the scavenging metal layer 210 is not pinched off between the nanosheet channels 214 so that both inner sheet regions (e.g., regions between two of the nanosheet channels 214, an example of which is labeled 203 in FIG. 2A) and outer sheet regions (e.g., regions of the nanosheet channels 214 which are not surrounded by another nanosheet channel, an example of which is labeled 205 in FIG. 2A) have the same work function and same Vt so that the nanosheets have the uniform Vt in each region 201, 201'. By pinched off, it is meant that the layer 222 (described in further detail below), is not contacted by itself but is rather separated by layer 212 (described in further detail below). If both inner sheet regions and outer sheet regions have the same Vt, the structure is treated as having uniform Vt, meaning that the surface around each nanosheet channel 214 has the same Vt.

A top capping layer 212 is formed over the scavenging metal layer 210 and surrounding nanosheet channels 214. The top capping layer 212 may be formed of TiN, although other suitable materials such as TiC may be used. The sizing of the top capping layer 212 will vary based on the size of the regions 201, 201' (e.g., such as based on the number of nanosheet channels 214 which are formed. The top capping layer 212 may generally have a thickness surrounding the nanosheet channels 214 (and the layers 216, 218, 220 and 222 described below) ranging from 0.5 nm to 2 nm. In some embodiments, the top capping layer 212 may be used to pinch off the nanosheet to provide uniform Vt.

Although FIG. 2A illustrates a structure with three nanosheet channels 214, embodiments are not limited to this arrangement. In other embodiments, more or fewer than three nanosheet channels may be used in the regions 201, 201'. The nanosheet channels 214 may be formed of Si, although other suitable materials such as group III-V semiconductors such as gallium arsenide (GaAs), indium phosphide (InP), gallium phosphide (GaP), gallium nitride (GaN) and indium gallium arsenide (InGaAs) may be used. Each nanosheet 214 may have a horizontal width (in direction X-X') ranging from 10 nm to 60 nm, and a vertical thickness (in direction Y-Y') ranging from 5 nm to 12 nm.

Each nanosheet channel 214 is surrounded by IL 216, which may be formed of $Si_xO_{1-x}$ or $Si_xN_{1-x-y}O_y$. In $Si_xO_{1-x}$, the value of x may range from 0.3 to 0.5. In $Si_xN_{1-x-y}O_y$, the value of x may range from 0.3 to 0.5 and the value of y may range from 0.1 to 0.5. The concentrate of N may range from 0.01 to 0.2. The IL 216 may have a thickness (in both direction X-X' and direction Y-Y') ranging from 0.8 nm to 1.5 nm. The IL 216 is surrounded by high-k dielectric layer 218, which may be formed of the same material and at the same time as the high-k dielectric layer 206 described above.

A bottom barrier layer 220, which may be formed of the same material and at the same time as the barrier layer 208, surrounds the high-k dielectric layer 218. WF1 metal layer 222, which may be formed of the same material and at the same time as scavenging metal layer 210, surrounds the bottom barrier layer 220.

Differing work functions WF1 and WF2 for regions 201 and 201', respectively, may be achieved in various ways. In some embodiments, the materials used for WF1 in region 201 and WF2 in region 201' may be the same, but have varying thicknesses in one or both of the scavenging metal layer 210 and in WF1 metal layer 222. In some embodiments, the different work functions may be achieved by using different top capping layers 212 for the different regions 201 and 201'. In other embodiments, the materials used for WF1 metal layer 222 may be different than the material used for forming WF2 metal layer 226 described below.

FIG. 2A, described above, illustrates the regions 201 and 201' in an nFET structure. FIG. 2B illustrates the regions 201 and 201' for a pFET structure. As will be described in further detail below with respect to FIGS. 6A-6D, the nFET in region 201 the pFET in region 201 are connected in a first CMOS structure while the nFET in region 201' and the pFET in region 201' are connected in a second CMOS structure.

FIGS. 2A and 2B show the same layers with the same sizing formed of the same materials as indicated by the use of the same reference numerals in FIGS. 2A and 2B. FIGS. 2A and 2B differ, however, in the material of the nanosheet channels. The material of the nanosheet channels 214 in the NFET structure of FIG. 2A is different than the material of the nanosheet channels 215 in the PFET structure of FIG. 2B. The material of the nanosheet channels 215 in the PFET structure of FIG. 2B may be based on the material used for the nanosheet channels 214 in the NFET structure of FIG. 2A. For example, if the nanosheet channels 214 are formed of Si, the nanosheet channels 215 may be formed of SiGe, where the germanium (Ge) concentration may range from 10% to 40%. In other embodiments, the nFET may utilize a group III-V semiconductor for nanosheet channels 214 while the pFET utilizes pure Ge for nanosheet channels 215.

Figure 3A:
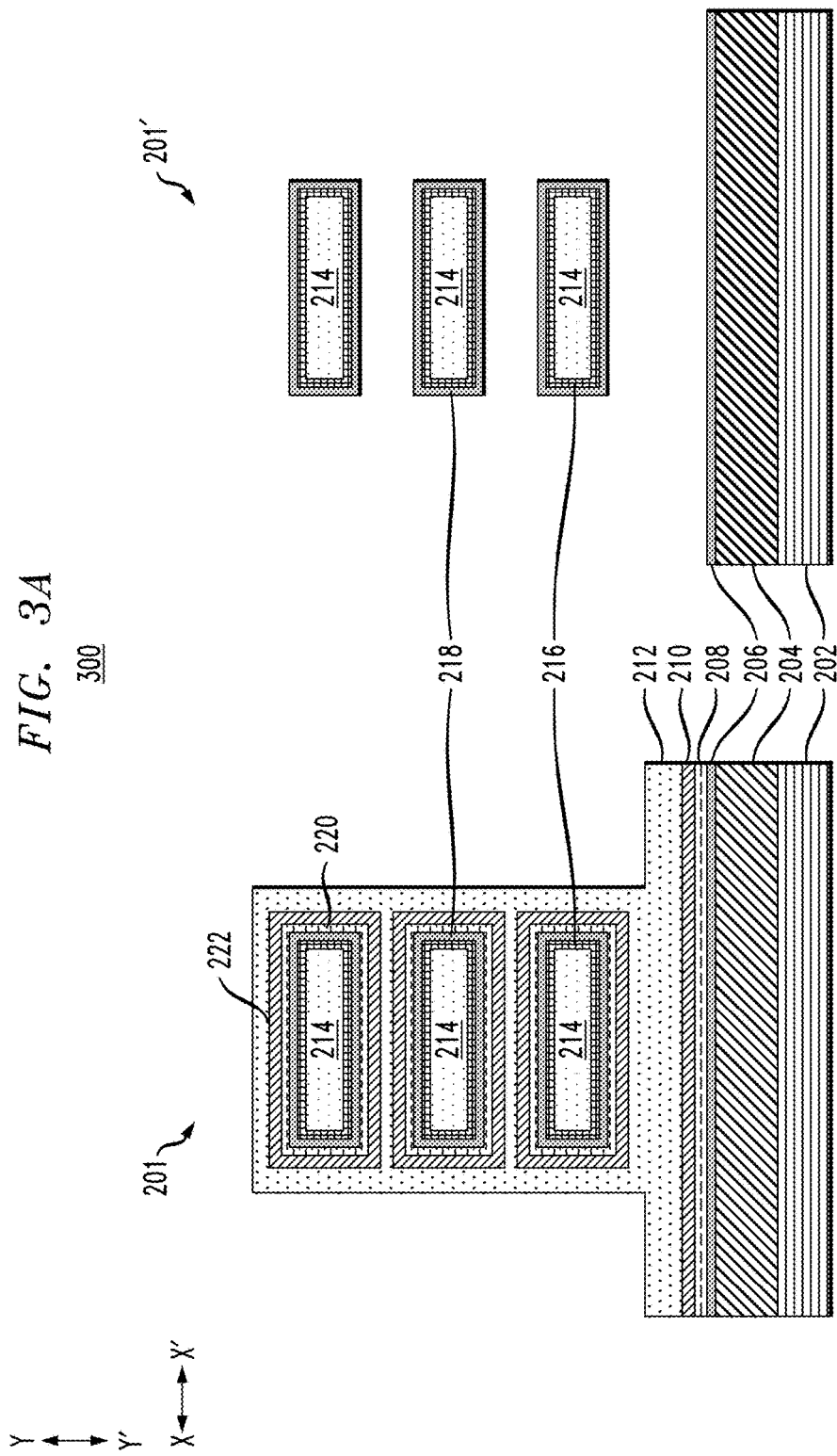
FIG. 3A illustrates a cross-sectional view of the FIG. 2A structure following removal of the first work function material from a portion of the structure, according to an embodiment of the present invention.

FIGS. 3A and 3B show cross sectional view 300 and 350, respectively, of the nFET and pFET structures of FIGS. 2A and 2B following patterning and removal of WF1 metal layer 222. For the nFET structures, the WF1 metal layer 222 is removed from region 201'. For the pFET structures, the WF1 metal layer 222 is removed from region 201. A mask may be patterned over the regions 201, 201' in both the nFET and pFET structures of FIGS. 2A and 2B, followed by removal of layers 208, 210, 212, 220 and 222 from the respective regions left exposed by the mask (e.g., region 201' for the nFET structures and region 201 for the pFET structures). The layers 208, 210, 212, 220 and 222 may be removed using wet etchants such as sulfur chloride (SCl) and hydrogen peroxide ($H_2O_2$), or other suitable processing such as selective reactive-ion etching (ME).

Figure 4A:
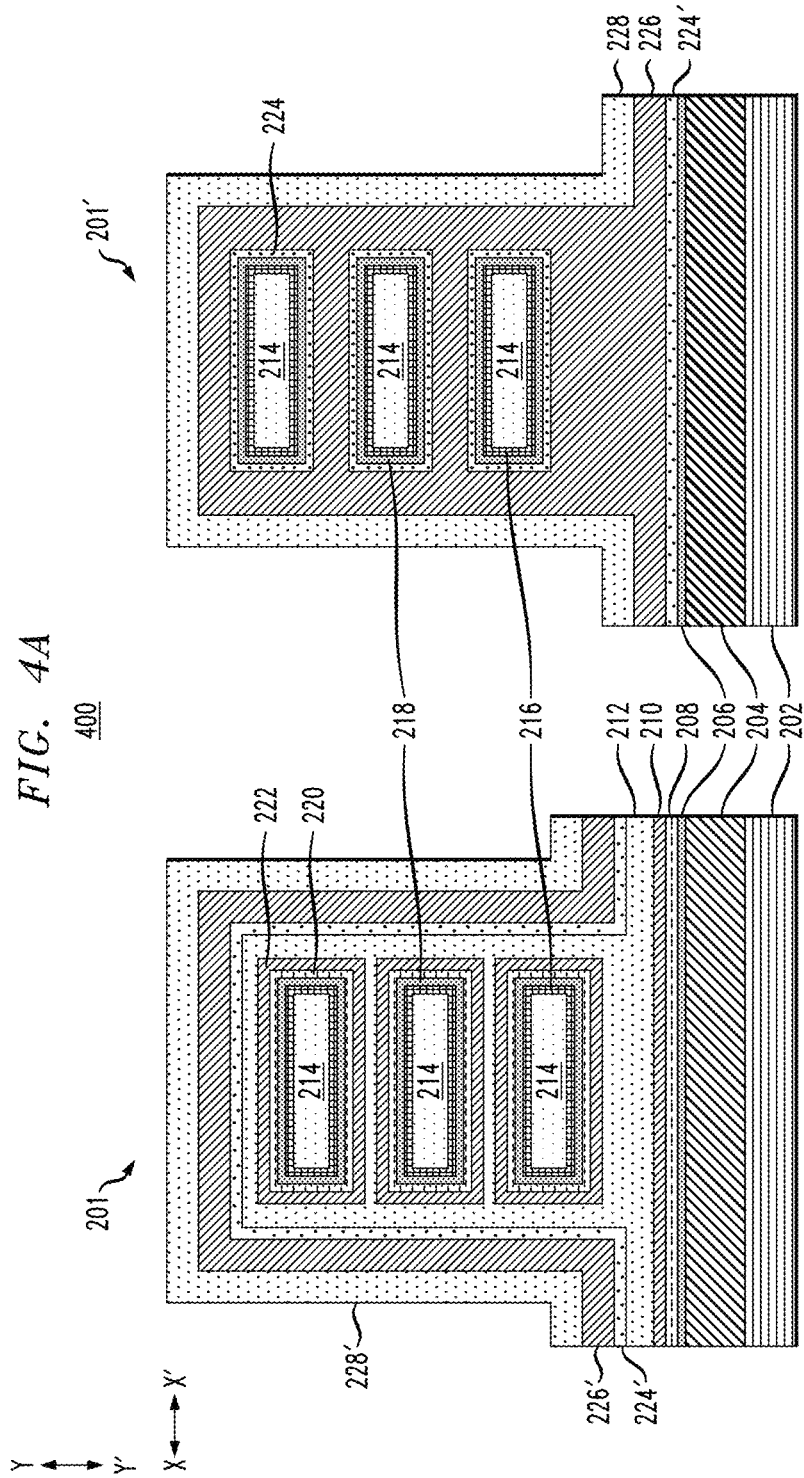
FIG. 4A illustrates a cross-sectional view of the FIG. 3A structure following deposition of a second work function material, according to an embodiment of the invention.
Figure 4B:
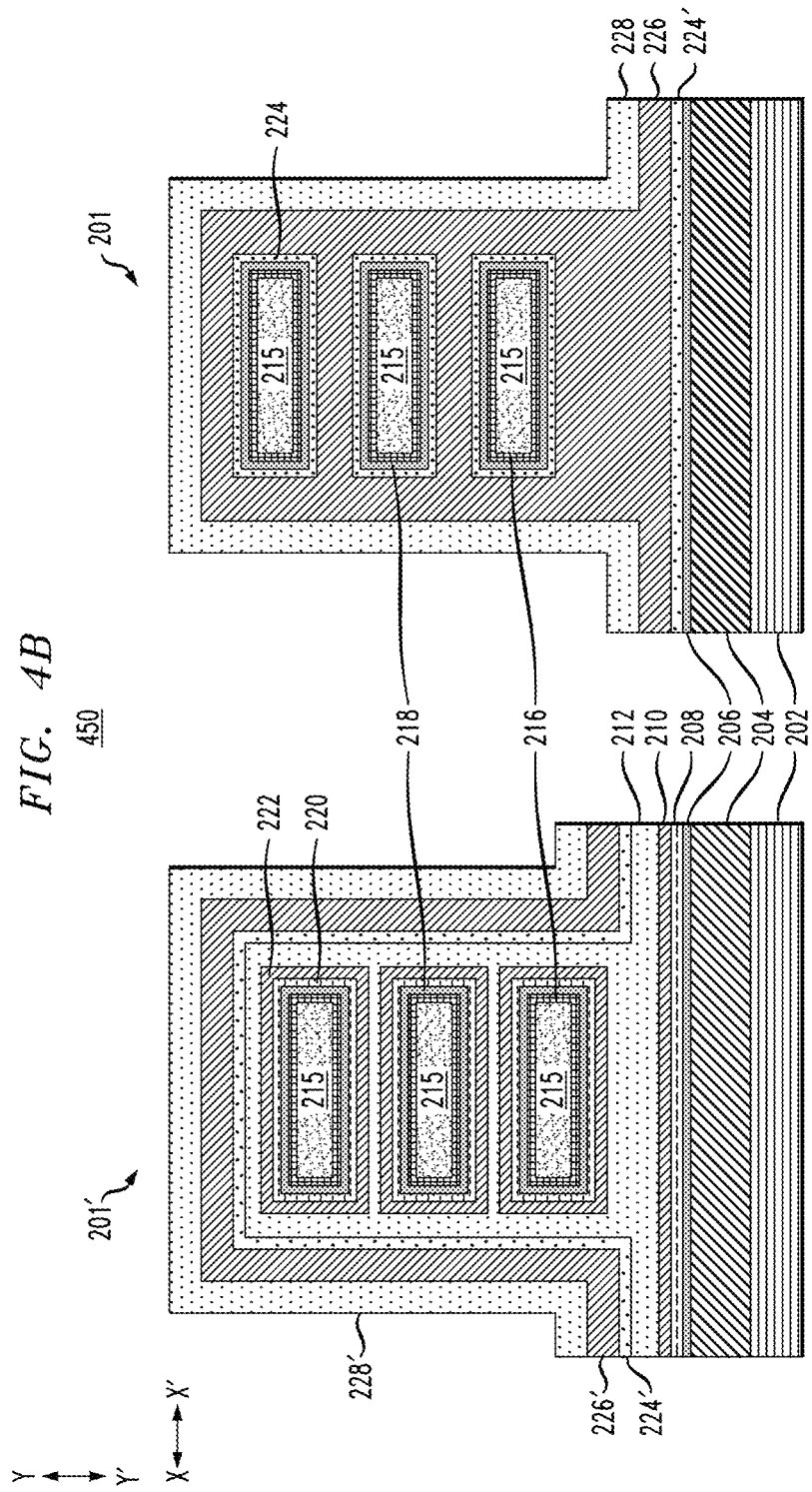
FIG. 4B illustrates a cross-sectional view of the FIG. 3B structure following deposition of a second work function material, according to an embodiment of the invention.

FIGS. 4A and 4B show cross-sectional views 400 and 450, respectively, of the nFET and pFET structures shown in FIGS. 3A and 3B following deposition of the second work function, or WF2, material. For the nFET structures, the WF2 material is deposited in region 201'. For the pFET structures, the WF2 material is deposited in region 201. Bottom barrier layer 224 is deposited to surround the nanosheet channels 214/215, the IL 216 and the high-k dielectric layer 218. For the nFET structures shown in FIG. 4A, deposition of the material for the bottom barrier layer 224 also results in a bottom barrier layer 224' being deposited over the nFET structure in region 201 and over the high-k dielectric layer 206 in region 201'. For the pFET structures shown in FIG. 4B, deposition of the material for the bottom barrier layer 224 also results in bottom barrier layer 224' being deposited over the pFET structure in region 201' and over the high-k dielectric layer 206 in region 201.

Next, WF2 metal layer 226 is deposited to surround the bottom barrier layer 224. For the nFET structures shown in FIG. 4A, deposition of the material for the WF2 metal layer 226 also results in formation of a layer 226' over the layer 224' in region 201. For the pFET structures shown in FIG. 4B, deposition of the material for the WF2 metal layer 226 also results in formation of the layer 226' over the layer 224' in region 201'.

Top capping layer 228 is formed over the WF2 metal layer 226. For the nFET structures shown in FIG. 4A, deposition of the material for the top capping layer 228 also results in formation of a layer 228' over the layer 226' in region 201.

For the pFET structures shown in FIG. 4B, deposition of the material for the top capping layer 228 also results in formation of the layer 228' over the layer 226' in region 201'.

The bottom barrier layer 224, WF2 metal layer 226 and top capping layer 228 in region 201' may be formed of the same materials as the bottom barrier layer 220, WF1 metal layer 222 and top capping layer 212 in region 201, respectively. In some embodiments, each layer stack is formed of TiN/TiAlC/TiN, with the thickness of the TiAlC differing for WF1 and WF2. For the nFET structures shown in FIG. 4A, the WF2 metal layer 226 in region 201' is thicker than the WF1 metal layer 222 in region 201. Similarly, for the PFET structures shown in FIG. 4B, the WF2 metal layer 226 in region 201 is thicker than the WF1 metal layer 222 in region 201'.

As described above, the thickness (in both direction X-X' and Y-Y') of the WF1 metal layer 222 surrounding the nanosheet channels 214/215 in regions 201 and 201' (for the NFET structures and PFET structures, respectively) may be in the range of 1 nm to 3 nm. The thickness of the WF2 metal layer 224 surrounding the nanosheet channels 214/215 in regions 201' and 201 (for the nFET structures and the pFET structures, respectively) may be in the range of 2 nm to 6 nm. In other embodiments, the WF2 metal layer 224 (e.g., the scavenging metal layer) is thicker so that this layer is pinched off between the sheets so that in an outer region the thickness of WF2 metal layer 224 is about the same total thickness between the sheets, although there is a seam.

Figure 5A:
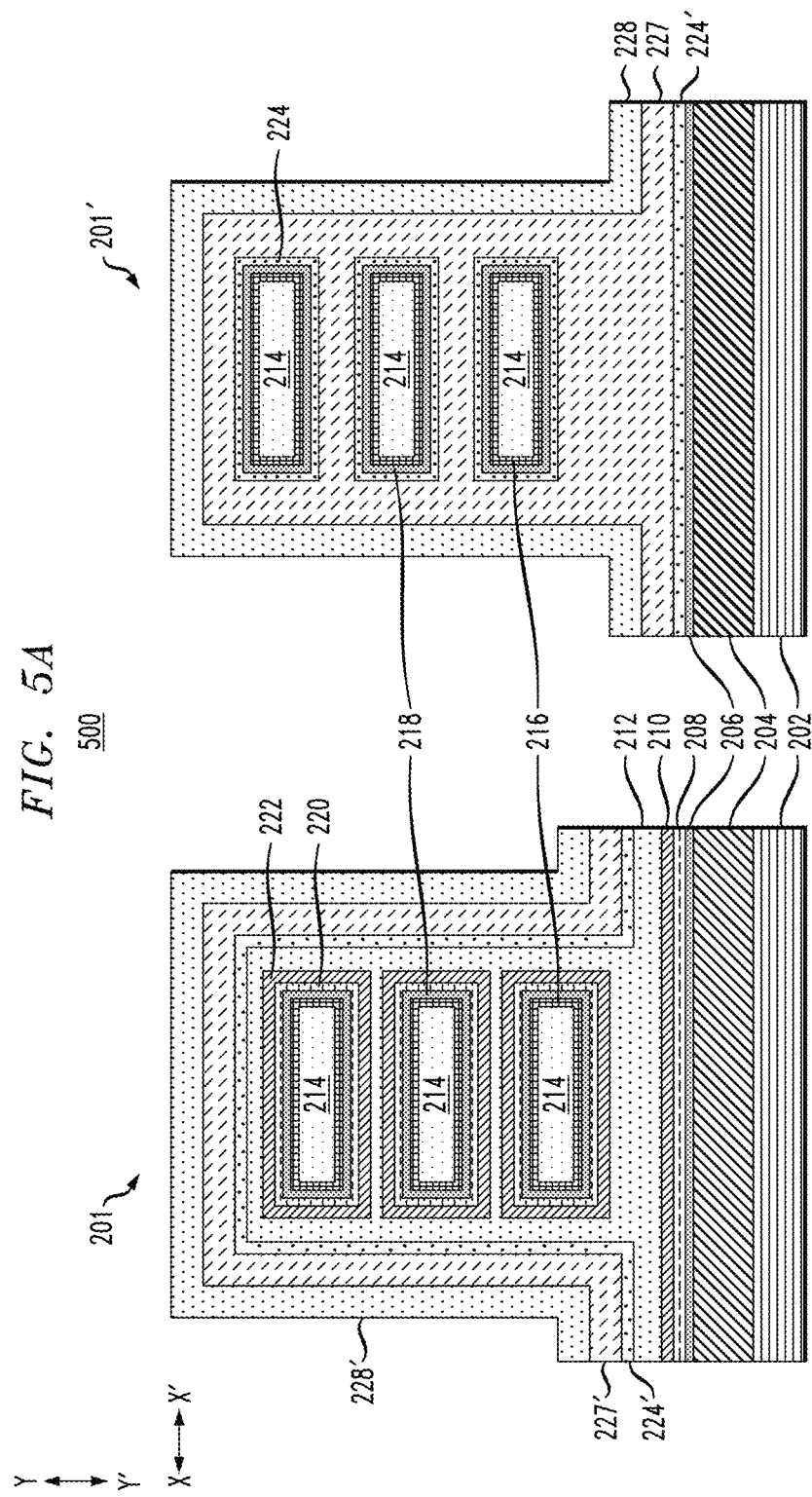
FIG. 5A illustrates a cross-sectional view of the FIG. 3A structure following deposition of a second work function material different than the first work function material, according to an embodiment of the invention.
Figure 5B:
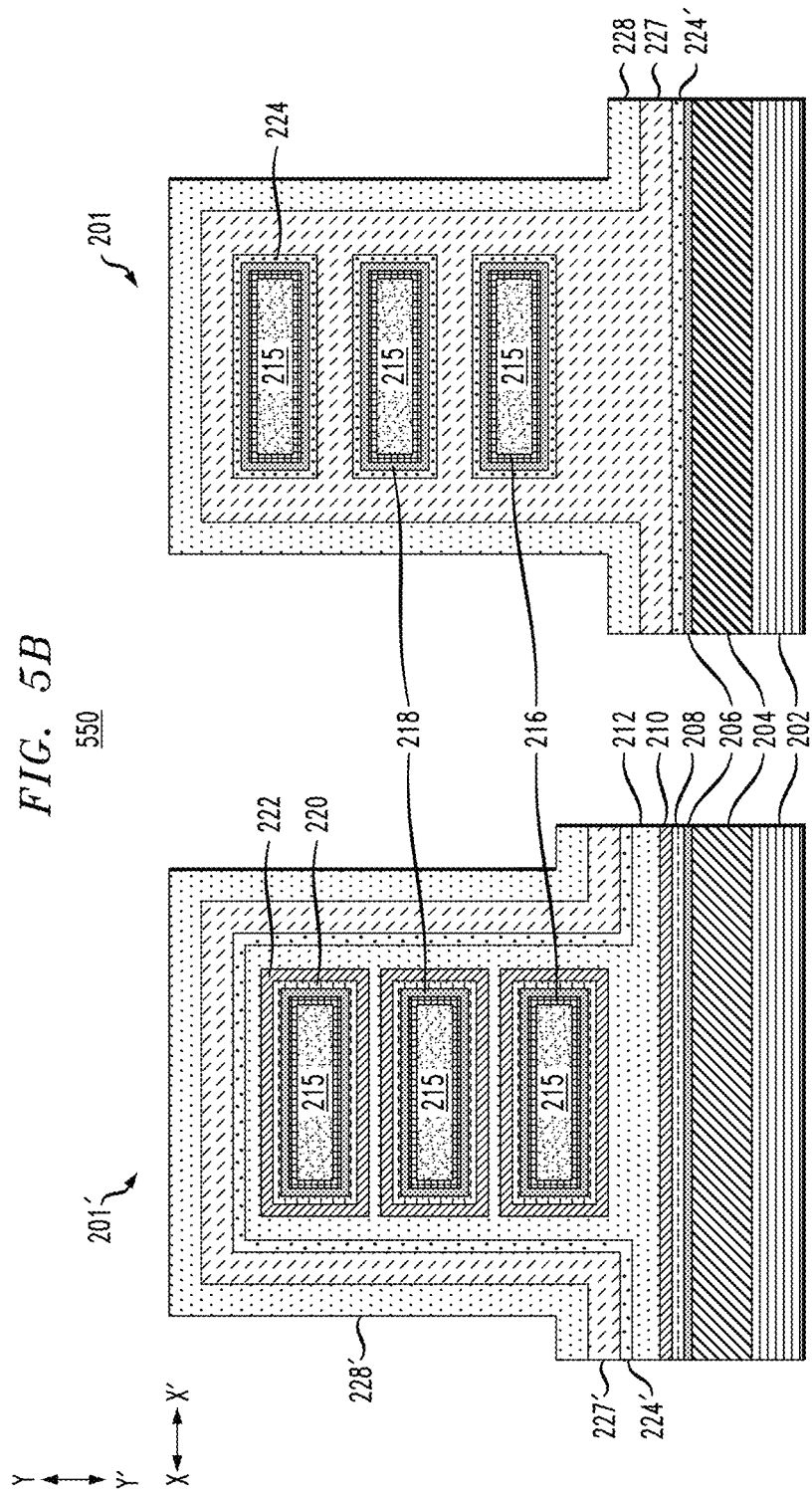
FIG. 5B illustrates a cross-sectional view of the FIG. 3B structure following deposition of a second work function material different than the first work function material, according to an embodiment of the invention.

Embodiments, however, are not limited to using the same materials but differing thicknesses for WF1 and WF2. In other embodiments, different materials may be used for WF1 and WF2. FIGS. 5A and 5B illustrate such an arrangement. FIGS. 5A and 5B show cross sectional views 500 and 550, respectively, of the nFET and pFET structures of FIGS. 3A and 3B following deposition of the second work function, or WF2, material, where the WF2 material differs from the WF1 material. Bottom barrier layer 224 is re-deposited to surround the nanosheet channels 214/215, the IL 216 and the high-k dielectric layer 218. Next, WF2 metal layer 227 is deposited to surround the bottom barrier layer 224. Top capping layer 228 is formed over the WF2 metal layer 227. Formation of the bottom barrier layer 224, WF2 metal layer 227 and capping layer 228 in region 201' also results in the deposition of such materials over region 201 as illustrated in FIGS. 5A and 5B and as denoted by corresponding element labels 224', 227', 228'.

The WF2 metal layer 227 is formed of a different material than the WF1 metal layer 222. For example, while the WF1 metal layer 222 is formed of TiAlC, the WF2 metal layer 227 may be formed of TiAl or TaAlC. In some embodiments, the bottom barrier layer 224 and top capping layer 228 may be formed of the same materials as bottom barrier layer 220 and top capping layer 212, respectively. In other embodiments, different materials may be used for at least one of the bottom barrier layer 224 and the top capping layer 228. For example, the bottom barrier layer 220 and top capping layer 212 may be formed of TiN while the bottom barrier layer 224 and top capping layer 228 may be formed of TiC or TaN. The thicknesses of the WF1 metal layer 222 and the WF2 metal layer 227 may be the same or may vary as desired.

FIG. 6A shows a top down view 600 of a structure, illustrating how the regions 201 and 201' described above with respect to FIGS. 2-5 are connected to form first and second CMOS structures.

The nFET structure in region 201 is connected with the pFET structure in region 201 in to form a first CMOS structure. In the first CMOS structure, WF1 metal stack provides nVt2 for the nFET and WF2 metal stack provides pVt2 for the pFET. The nFET structure in region 201' is connected with the pFET structure in region 201' to form a second CMOS structure. In the second CMOS structure, WF2 metal stack provides nVt1 for the nFET and WF1 metal stack provides pVt1 for the pFET.

Although FIG. 6A shows the first and second CMOS structures as being next to one another, this is not a requirement. One or more other CMOS structures may be formed between the first and second CMOS structures shown in FIG. 6A. For example, multiple instances of the first CMOS structure and the second CMOS structure may be formed as desired. Fins 604 provide source/drain regions between the first CMOS structure and the second CMOS structure surrounding the gates 602-1 and 602-2.

Figure 6B:
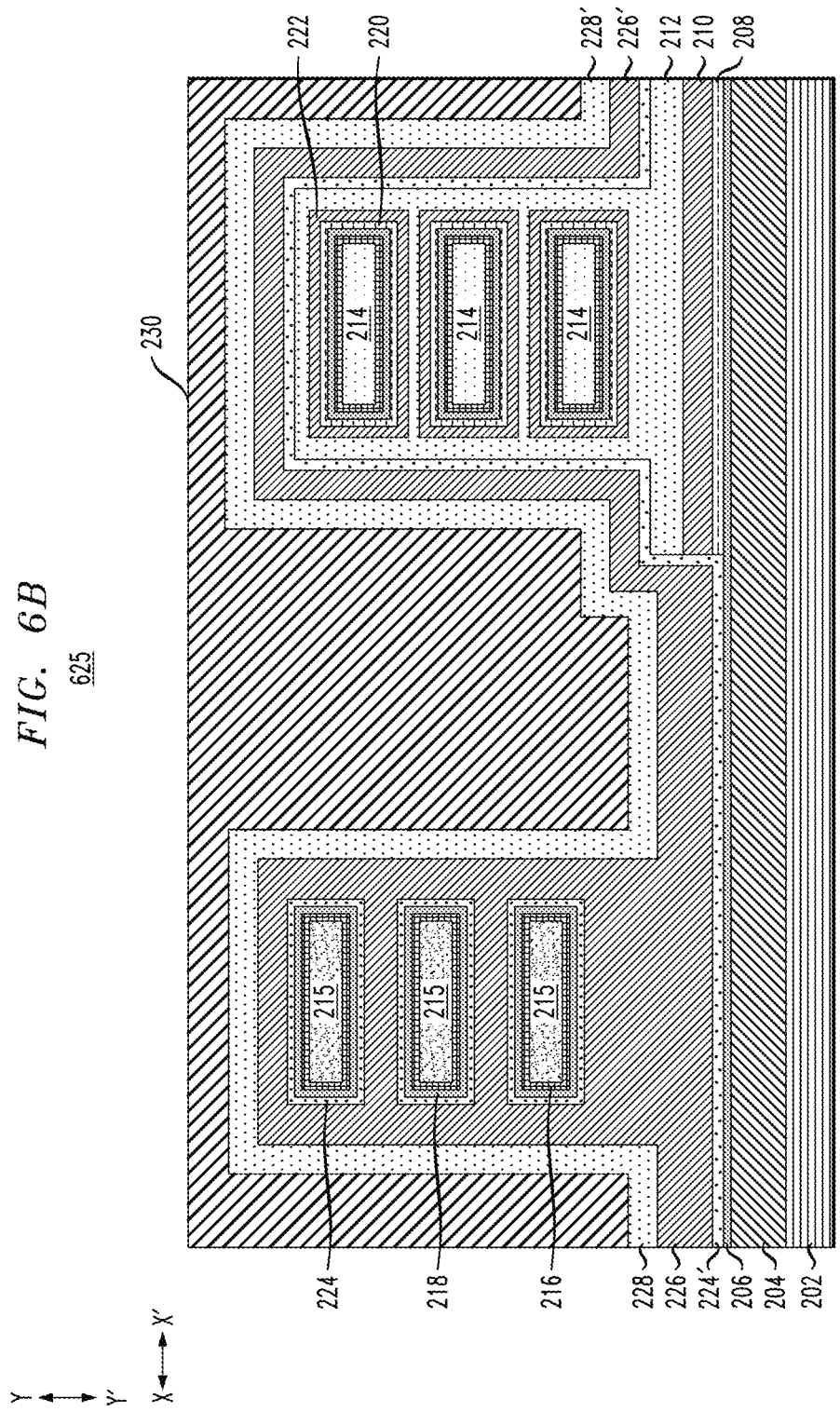
FIG. 6B illustrates a cross-sectional view taken along the line A-A in FIG. 6A, according to an embodiment of the invention.
Figure 6C:
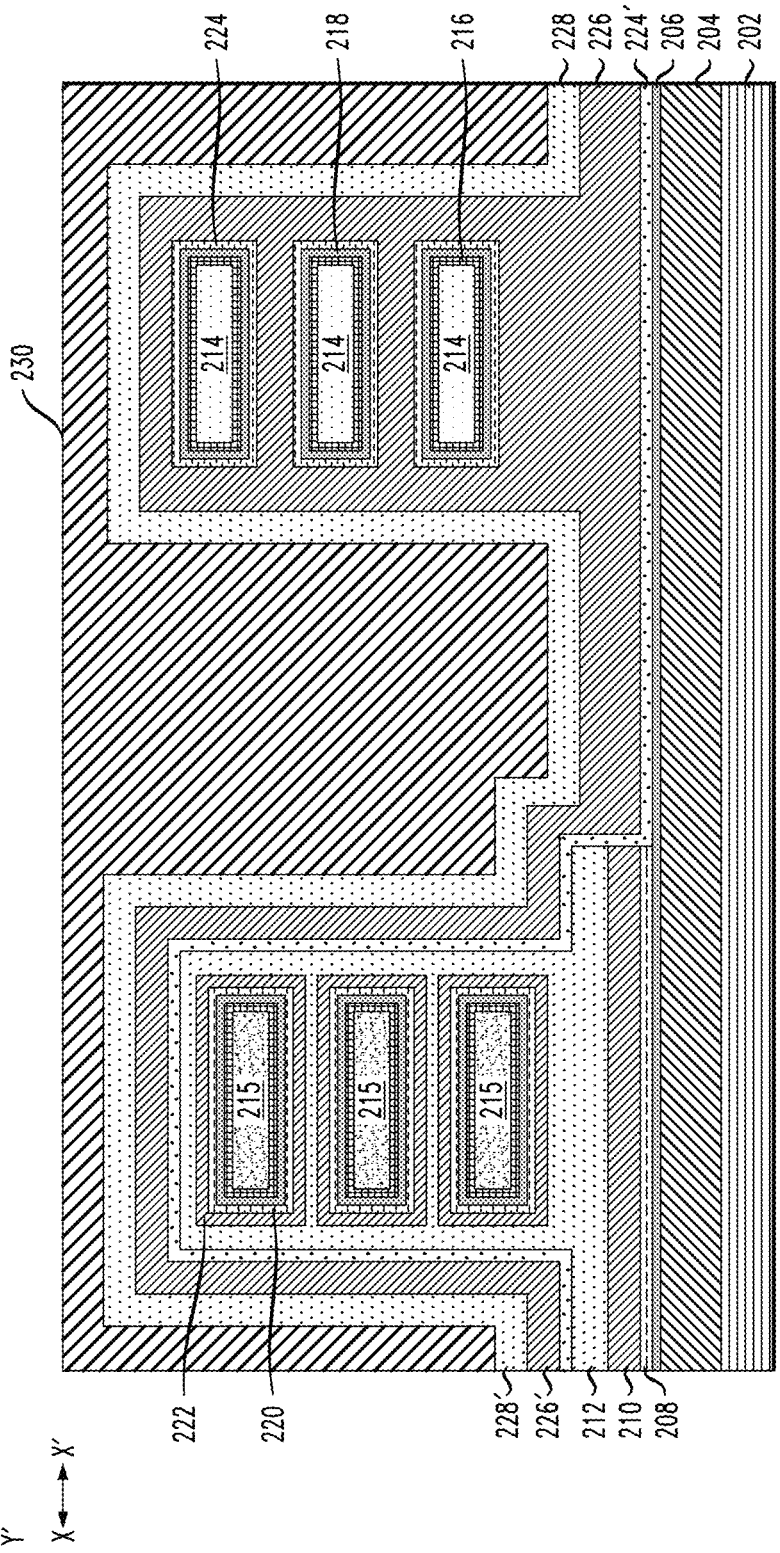
FIG. 6C illustrates a cross-sectional view taken along the line B-B in FIG. 6A, according to an embodiment of the invention.

FIG. 6B shows a cross-sectional view 625 of the first CMOS structure, taken along line A-A in FIG. 6A. FIG. 6C shows a cross-sectional view 650 of the second CMOS structure, taken along the line B-B in FIG. 6A. FIGS. 6B and 6C illustrate the gate electrode 230 formed over the tops of the nFET and pFET structures.

Figure 6D:
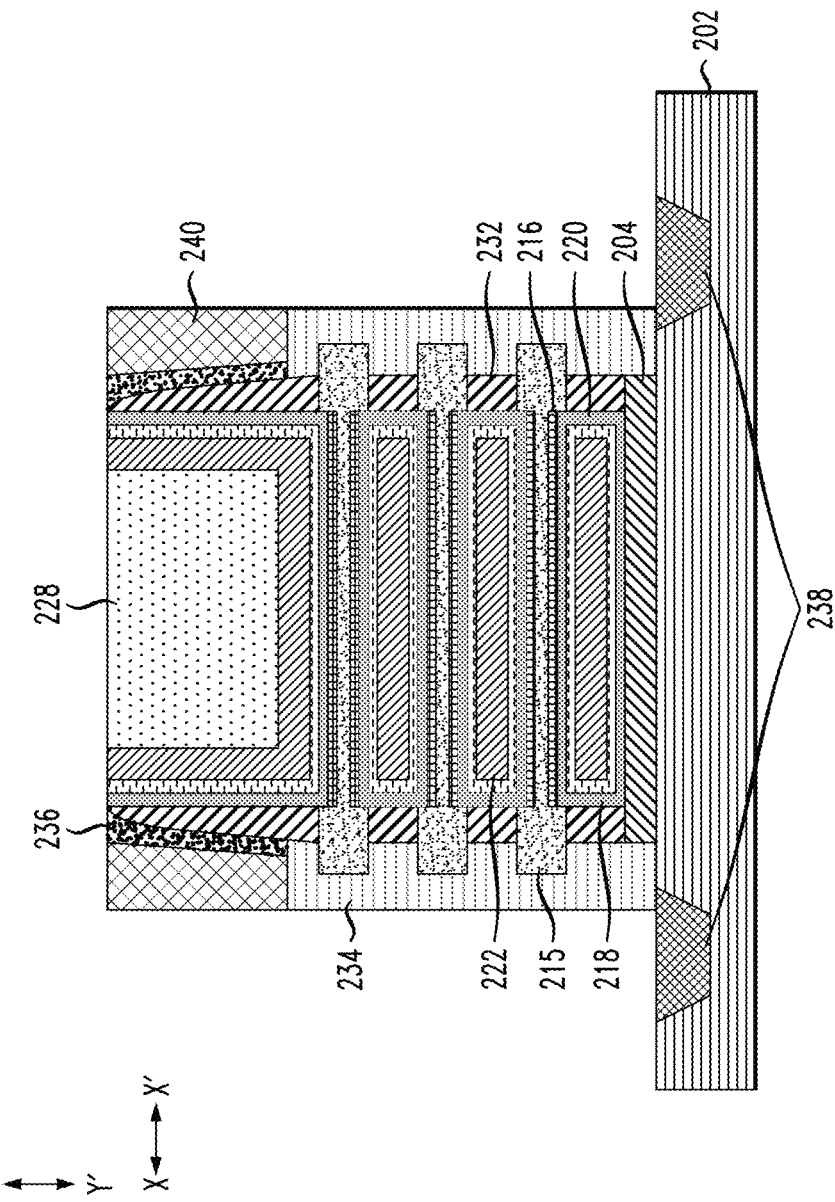
FIG. 6D illustrates a cross-sectional view taken along the line C-C in FIG. 6A, according to an embodiment of the invention.

FIG. 6D shows a cross-sectional view 675 taken along line C-C in FIG. 6A. FIG. 6D illustrates spacers 232, source/drain region 234, spacers 236, shallow trench insulators 238 and source/drain contacts and interconnects 240.

The spacers 232 may be formed of SiN, SiBCN, SiCON, SiCO or another suitable material, and may have a horizontal width (in direction X-X') ranging from 3 nm to 20 nm. The vertical thickness (in direction Y-Y') of the spacers 232 may match that of the spacing between the nanosheet channels 214.

The source/drain regions 234 may be formed of silicon phosphorus ($Si_xP_y$) or silicon carbon phosphorus (SiCP) for nFET, and $Si_xGe_y$ for PFET. The horizontal width (in direction X-X') and the vertical thickness (in direction Y-Y') of the source/drain regions 234 may match that of the surrounding regions as illustrated.

The spacers 236 may be formed of SiN, SiBCN, SiCON, SiCO or another suitable material, and may have a horizontal width (in direction X-X') ranging from 3 nm to 10 nm.

Device isolation may be achieved using shallow trench insulator (STI) and/or deep trench insulator (DTI) features. FIG. 6D shows STIs 238, which may be formed of $Si_xO_y$ or $Si_xN_y$. The sizing of the STIs 238 may match that of the surrounding structure as illustrated.

Source/drain contacts and interconnects 240 connect the source and drains of the devices. The contacts in layer 240 may be formed of a silicide, such as titanium silicide (TiS) although other suitable materials may be used. The interconnects in layer 240 may be formed of tungsten (W), cobalt (Co) or another low resistance metal such as silver (Ag), ruthenium (Ru), etc. Each of the layers 240 may have a horizontal width (in direction X-X') and a vertical thickness (in direction Y-Y') which matches that of the surrounding structure as illustrated.

In some embodiments, a method of forming a semiconductor structure comprises depositing a first work function metal layer surrounding nanosheet channels in nanosheet channel stacks for a first CMOS structure and at least a second CMOS structure, each of the first CMOS structure and the second CMOS structure comprising a first nanosheet channel stack for an nFET comprising two or more nanosheet channels of a first channel material and a second nanosheet channel stack for a pFET comprising two or more nanosheet channels of a second channel material different than the first channel material. The method also includes patterning to remove the first work function metal layer surrounding the two or more nanosheet channels in the first nanosheet channel stack of the first CMOS structure and to remove the first work function metal layer surrounding the two or more nanosheet channels in the second nanosheet channel stack of the second CMOS structure. The method further includes depositing a second work function metal layer to surround the two or more nanosheet channels in the first nanosheet channel stack of the first CMOS structure and to surround the two or more nanosheet channels in the second nanosheet channel stack of the second CMOS structure. The nFET and the pFET of the first CMOS structure each have a first threshold voltage and the nFET and the pFET of the second CMOS structure each have a second threshold voltage different than the first threshold voltage.

In some embodiments, the first work function metal layer comprises a first thickness and the second work function metal layer comprises a second thickness different than the first thickness. In other embodiments, the first work function metal layer comprises a first work function metal material and the second work function metal layer comprises a second work function metal material different than the first work function metal material. The first work function metal material and the second work function metal material may each comprises one of Ti, Al, TiAl, TaAlC, TiAlC, or a combination of Ti and Al alloys. In some embodiments, the first work function metal layer comprises a first thickness and a first work function metal material, and the second work function metal layer comprises a second thickness different than the first thickness and a second work function metal material different than the first work function metal material.

The method may further comprise forming a capping layer surrounding the first work function metal layer between the two or more nanosheet channels in the second nanosheet channel stack of the first CMOS structure and surrounding the first work function metal layer between the two or more nanosheet channels in the first nanosheet channel stack of the second CMOS structure. The first work function metal layer may comprise a scavenging metal material and the capping layer may comprise a non-scavenging metal.

In some embodiments, the first work function metal layer pinches off between the two or more nanosheet channels in the second nanosheet channel stack of the first CMOS structure but does not pinch off between the two or more nanosheet channels in the first nanosheet channel stack of the first CMOS structure. The two or more nanosheet channels in the first nanosheet channel stack of the first CMOS structure and the two or more nanosheet channels in the second nanosheet channel stack of the first CMOS structure may have a uniform threshold voltage.

In some embodiments, a semiconductor structure comprises a first CMOS structure and at least a second CMOS structure, each of the first CMOS structure and the second CMOS structure comprising a first nanosheet channel stack for an nFET comprising two or more nanosheet channels of a first channel material and a second nanosheet channel stack for a pFET comprising two or more nanosheet channels of a second channel material different than the first channel material. The semiconductor structure further comprises a first work function metal layer surrounding the two or more nanosheet channels of the second nanosheet channel stack in the first CMOS structure and the two or more nanosheet channels of the first nanosheet channel stack in the second CMOS structure, and a second work function metal layer surrounding the two or more nanosheet channels of the first nanosheet channel stack in first CMOS structure and the two or more nanosheet channels of the second nanosheet channel stack in the second CMOS structure. The nFET and the pFET of the first CMOS structure each have a first threshold voltage and the nFET and the pFET of the second CMOS structure each have a second threshold voltage different than the first threshold voltage. In some embodiments, an integrated circuit comprises the semiconductor structure.

In some embodiments, the first work function metal layer comprises a first thickness and the second work function metal layer comprises a second thickness different than the first thickness. In other embodiments, the first work function metal layer comprises a first work function metal material and the second work function metal layer comprises a second work function metal material different than the first work function metal material. The first work function metal material and the second work function metal material may each comprise one of Ti, Al, TiAl, TaAlC, TiAlC, or a combination of Ti and Al alloys. In some embodiments, the first work function metal layer comprises a first thickness and a first work function metal material, and wherein the second work function metal layer comprises a second thickness different than the first thickness and a second work function metal material different than the first work function metal material.

The semiconductor structure may further comprise a capping layer surrounding the first work function metal layer between the two or more nanosheet channels in the second nanosheet channel stack of the first CMOS structure and surrounding the first work function metal layer between the two or more nanosheet channels in the first nanosheet channel stack of the second CMOS structure. The first work function metal layer may comprise a scavenging metal material and the capping layer may comprise a non-scavenging metal.

In the description above, various materials and dimensions for different elements are provided. Unless otherwise noted, such materials are given by way of example only and embodiments are not limited solely to the specific examples given. Similarly, unless otherwise noted, all dimensions are given by way of example and embodiments are not limited solely to the specific dimensions or ranges given.

Semiconductor devices and methods for forming same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require, for example, CMOSs, metal-oxide-semiconductor field-effect transistors (MOSFETs), and/or FinFETs. By way of non-limiting example, the semiconductor devices can include, but are not limited to CMOS, MOSFET, and FinFET devices, and/or semiconductor devices that use CMOS, MOSFET, and/or FinFET technology.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor structure, comprising:
    depositing a first work function metal layer surrounding nanosheet channels in nanosheet channel stacks for a first complementary metal-oxide-semiconductor (CMOS) structure and at least a second CMOS structure, each of the first CMOS structure and the second CMOS structure comprising a first nanosheet channel stack for a negative-channel field-effect transistor (nFET) comprising two or more nanosheet channels of a first channel material and a second nanosheet channel stack for a positive-channel field-effect transistor (pFET) comprising two or more nanosheet channels of a second channel material different than the first channel material;
    patterning to remove the first work function metal layer surrounding the two or more nanosheet channels in the first nanosheet channel stack of the first CMOS structure and to remove the first work function metal layer surrounding the two or more nanosheet channels in the second nanosheet channel stack of the second CMOS structure; and
    depositing a second work function metal layer to surround the two or more nanosheet channels in the first nanosheet channel stack of the first CMOS structure and to surround the two or more nanosheet channels in the second nanosheet channel stack of the second CMOS structure.

2. The method of claim 1, wherein the nFET and the pFET of the first CMOS structure each have a first threshold voltage and the nFET and the pFET of the second CMOS structure each have a second threshold voltage different than the first threshold voltage.

3. The method of claim 1, wherein the first work function metal layer comprises a first thickness and the second work function metal layer comprises a second thickness different than the first thickness.

4. The method of claim 1, wherein the first work function metal layer comprises a first work function metal material and the second work function metal layer comprises a second work function metal material different than the first work function metal material.

5. The method of claim 4, wherein the first work function metal material and the second work function metal material each comprises one of titanium (Ti), aluminum (Al), titanium aluminum (TiAl), tantalum aluminum carbon (TaAlC), titanium aluminum carbon (TiAlC), or a combination of Ti and Al alloys.

6. The method of claim 1, wherein the first work function metal layer comprises a first thickness and a first work function metal material, and wherein the second work function metal layer comprises a second thickness different than the first thickness and a second work function metal material different than the first work function metal material.

7. The method of claim 1, further comprising forming a capping layer surrounding the first work function metal layer between the two or more nanosheet channels in the second nanosheet channel stack of the first CMOS structure and surrounding the first work function metal layer between the two or more nanosheet channels in the first nanosheet channel stack of the second CMOS structure.

8. The method of claim 1, wherein the first work function metal layer pinches off between the two or more nanosheet channels in the second nanosheet channel stack of the first CMOS structure but does not pinch off between the two or more nanosheet channels in the first nanosheet channel stack of the first CMOS structure.

9. The method of claim 1, wherein the two or more nanosheet channels in the first nanosheet channel stack of the first CMOS structure and the two or more nanosheet channels in the second nanosheet channel stack of the first CMOS structure have a uniform threshold voltage.

10. A semiconductor structure, comprising:
    a first complementary metal-oxide-semiconductor (CMOS) structure and at least a second CMOS structure, each of the first CMOS structure and the second CMOS structure comprising a first nanosheet channel stack for a negative-channel field-effect transistor (nFET) comprising two or more nanosheet channels of a first channel material and a second nanosheet channel stack for a positive-channel field-effect transistor (pFET) comprising two or more nanosheet channels of a second channel material different than the first channel material;
    a first work function metal layer surrounding the two or more nanosheet channels of the second nanosheet channel stack in the first CMOS structure and the two or more nanosheet channels of the first nanosheet channel stack in the second CMOS structure; and
    a second work function metal layer surrounding the two or more nanosheet channels of the first nanosheet channel stack in first CMOS structure and the two or more nanosheet channels of the second nanosheet channel stack in the second CMOS structure.

11. The semiconductor structure of claim 10, wherein the first work function metal layer comprises a first thickness and the second work function metal layer comprises a second thickness different than the first thickness.

12. The semiconductor structure of claim 10, wherein the first work function metal layer comprises a first work function metal material and the second work function metal layer comprises a second work function metal material different than the first work function metal material.

13. The semiconductor structure of claim 12, wherein the first work function metal material and the second work function metal material each comprises one of titanium (Ti), aluminum (Al), titanium aluminum (TiAl), tantalum aluminum carbon (TaAlC), titanium aluminum carbon (TiAlC), or a combination of Ti and Al alloys.

14. The semiconductor structure of claim 10, wherein the first work function metal layer comprises a first thickness and a first work function metal material, and wherein the second work function metal layer comprises a second thickness different than the first thickness and a second work function metal material different than the first work function metal material.

15. The semiconductor structure of claim 10, further comprising a capping layer surrounding the first work function metal layer between the two or more nanosheet channels in the second nanosheet channel stack of the first CMOS structure and surrounding the first work function metal layer between the two or more nanosheet channels in the first nanosheet channel stack of the second CMOS structure.

16. The semiconductor structure of claim 15, wherein the first work function metal layer comprises a scavenging metal material and the capping layer comprises a non-scavenging metal.

17. An integrated circuit comprising:
a semiconductor structure comprising a first complementary metal-oxide-semiconductor (CMOS) structure and at least a second CMOS structure;
wherein each of the first CMOS structure and the second CMOS structure comprises a first nanosheet channel stack for a negative-channel field-effect transistor (nFET) comprising two or more nanosheet channels of a first channel material and a second nanosheet channel stack for a positive-channel field-effect transistor (pFET) comprising two or more nanosheet channels of a second channel material different than the first channel material;
wherein a first work function metal layer surrounds the two or more nanosheet channels of the second nanosheet channel stack in the first CMOS structure and the two or more nanosheet channels of the first nanosheet channel stack in the second CMOS structure; and
wherein a second work function metal layer surrounds the two or more nanosheet channels of the first nanosheet channel stack in first CMOS structure and the two or more nanosheet channels of the second nanosheet channel stack in the second CMOS structure.

18. The integrated circuit of claim 17, wherein the first work function metal layer comprises a first thickness and the second work function metal layer comprises a second thickness different than the first thickness.

19. The integrated circuit of claim 17, wherein the first work function metal layer comprises a first work function metal material and the second work function metal layer comprises a second work function metal material different than the first work function metal material.

20. The integrated circuit of claim 17, wherein the first work function metal material and the second work function metal material each comprises one of titanium (Ti), aluminum (Al), titanium aluminum (TiAl), tantalum aluminum carbon (TaAlC), titanium aluminum carbon (TiAlC), or a combination of Ti and Al alloys.

* * * * *